United States Patent
Chang (10) Patent No.: US 6,689,631 B2
(45) Date of Patent: Feb. 10, 2004

(54) SEMICONDUCTOR LIGHT-EMITTING DEVICE WITH IMPROVED ELECTRO-OPTICAL CHARACTERISTICS AND METHOD OF MANUFACTURING THE SAME

(75) Inventor: Dong-hoon Chang, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 138 days.

(21) Appl. No.: 10/014,884

(22) Filed: Dec. 14, 2001

(65) Prior Publication Data

US 2002/0109149 A1 Aug. 15, 2002

(30) Foreign Application Priority Data

Dec. 19, 2000 (KR) ........................................ 2000-78543

(51) Int. Cl.[7] .............................................. H01L 21/00
(52) U.S. Cl. .............................. 438/29; 438/30; 438/31; 438/32; 257/E33.011
(58) Field of Search ............................. 438/29–32, 700, 438/945; 257/E33.011

(56) References Cited

U.S. PATENT DOCUMENTS

| | | |
|---|---|---|
| 5,034,092 A | 7/1991 | Lebby et al. |
| 5,116,461 A | 5/1992 | Lebby et al. |
| 5,262,360 A | 11/1993 | Holonyak, Jr. et al. |
| 5,373,522 A | 12/1994 | Holonyak, Jr. et al. |
| 5,493,577 A | 2/1996 | Choquette et al. |
| 5,903,589 A | 5/1999 | Jewell |
| 6,156,582 A | 12/2000 | Shieh et al. |

FOREIGN PATENT DOCUMENTS

EP  0 542 479  5/1993

OTHER PUBLICATIONS

Shin H–E et al., "780 nm Oxidised Vertical–Cavity Surface–Emitting Lasers with A10.11GaO.89As Quantam Wells," *Electronics Letters*. vol. 32, No. 14, Jul. 4, 1996. pp. 1287–1288.

Evans P. W. et al., "Planar Anisotropic Oxidation of Graded Algaas for High Resolution Vertical–Wall Current and Light Guiding in Laser Diodes," *Applied Physics Letters*, Vo. 71, No. 2, Jul. 14, 1997, pp. 261–263.

Kent D. Choquette, H.Q. Kou, K.M. Geib, and B.E. Hammons, Selectively Oxidized Vertical–Cavity Laser Performance and Technology, pp. 283–288 (IEEE 1998).

*Primary Examiner*—George Fourson
*Assistant Examiner*—Thanh Pham
(74) *Attorney, Agent, or Firm*—Staas & Halsey LLP (57) ABSTRACT

A semiconductor light-emitting device having a resonant cavity structure for emitting light perpendicularly to the plane of an active region, and a method of manufacturing the same. A post has a window of an upper electrode and a current aperture of an oxidized layer. Resonated light is emitted through the window and the current aperture. The post is formed by a sidewall of a pre-oxidized layer included in the post is exposed, and the pre-oxidized layer is horizontally oxidized by an oxidizing process by a predetermined distance from the sidewall thereof. An oxidized portion of the pre-oxidized layer becomes a high-resistance portion, and an un-oxidized portion of the pre-oxidized layer becomes the current aperture through which a current or light passes. Since the post is formed by way of self-alignment using the upper electrode and the current aperture is formed by oxidizing the exposed sidewall of the post, the central axis of the window of the upper electrode and the central axis of the current aperture are automatically aligned. Due to the alignment between the window and the current aperture, the electro-optical characteristics of a vertical cavity surface emitting laser (VCSEL) are improved.

30 Claims, 8 Drawing Sheets

SEMICONDUCTOR LIGHT-EMITTING DEVICE WITH IMPROVED ELECTRO-OPTICAL CHARACTERISTICS AND METHOD OF MANUFACTURING THE SAME

CROSS-REFERENCE TO RELATED APPLICATIONS

This application claims the benefit of Korean Application No. 2000-78543 filed Dec. 19, 2000 in the Korean Patent Office, the disclosure of which is incorporated herein by reference.

BACKGROUND OF THE INVENTION

1. Field of the Invention

The present invention relates to a semiconductor light-emitting device having a resonant cavity structure for emitting light perpendicularly to the plane of an active region and a method of manufacturing the same. More particularly, the present invention relates to a semiconductor light-emitting device in which a central axis of an upper electrode window, through which resonated light is emitted, and a central axis of a current aperture of an oxidized layer are automatically aligned, and a method of manufacturing the same.

2. Description of the Related Art

Semiconductor light-emitting devices, first developed by General Electric (GE) in 1962, are designed to recombine electrons with holes by applying forward current across a PN junction in a compound semiconductor to generate light having a wavelength corresponding to band gap energy determined according to a structure of the semiconductor.

Semiconductor light-emitting devices are divided according to a process of emitting light into a light emitting diode, which emits incoherent light using spontaneous emission, and a semiconductor laser, which emits coherent light using stimulated emission.

Semiconductor lasers are divided according to the positions of their reflectors. For example, a Fabry-Perot semiconductor laser has reflectors that are positioned at opposite sides of a chip. A Vertical Cavity Surface Emitting Laser (VCSEL) having a resonant cavity structure has reflectors that are horizontally positioned within a chip.

VCSELs do not need an optical system to correct the shape of a beam because they emit a nearly circular Gaussian beam in a direction in which semiconductor material layers are stacked. In addition, since the size of VCSELs is small, a plurality of lasers can be integrated on a single semiconductor wafer. Therefore, VCSELs have a wide range of optical applications such as optical communication, electronic calculators, audio-video devices, laser printers, laser scanners and medical instruments.

Figure 1A:
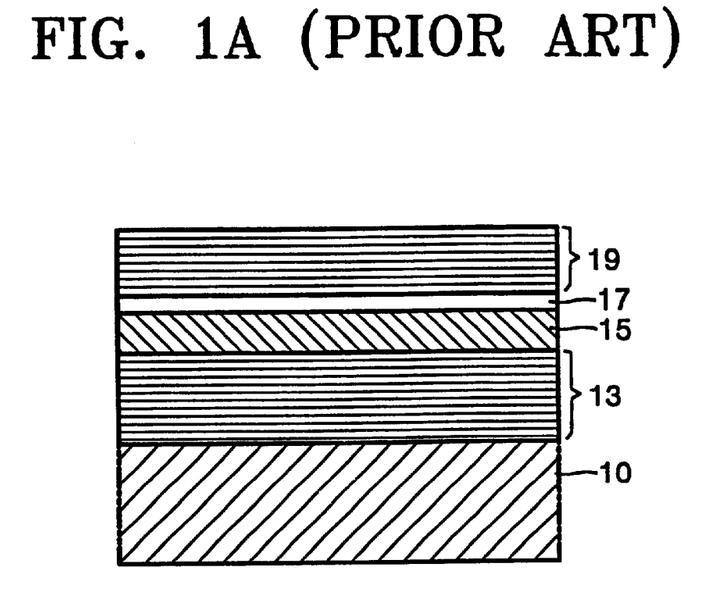
FIGS. 1A through 1E are sectional views of a Vertical Cavity Surface Emitting Laser (VCSEL) at various stages of process according to a conventional manufacturing technique.

FIGS. 1A through 1E show a conventional method of manufacturing a VCSEL. FIG. 1A shows that a lower reflector layer 13, an active layer 15, a pre-oxidized layer 17, and an upper reflector layer 19 are sequentially stacked on a substrate 10. Here, the substrate 10 is formed of, for example, a semiconductor material having n-type impurities. The lower reflector layer 13 is doped with impurities of the same type as the substrate 10. For example, the lower reflector layer 13 is formed by stacking 20–30 layers of n-type GaAs, in which the ratio of Ga to As is different in each layer, on top of the substrate 10. The upper reflector layer 19 is formed of the same semiconductor material as the lower reflector layer 13 but contains the opposite type of impurities to those contained in the lower reflector layer 13.

In other words, the upper reflector layer 19 is formed of p-type GaAs. The pre-oxidized layer 17 is subjected to a horizontal oxidation process in vapor.

Figure 1B:
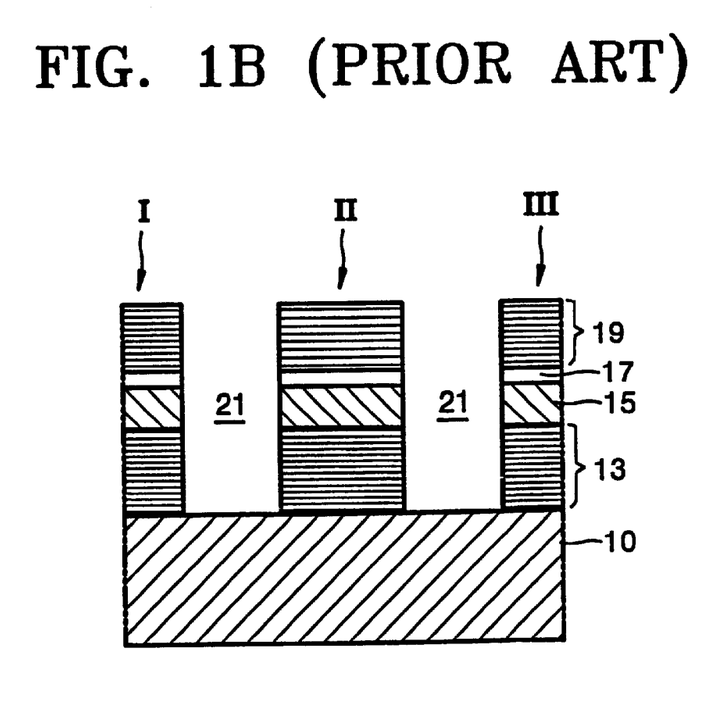
Figure 1C:
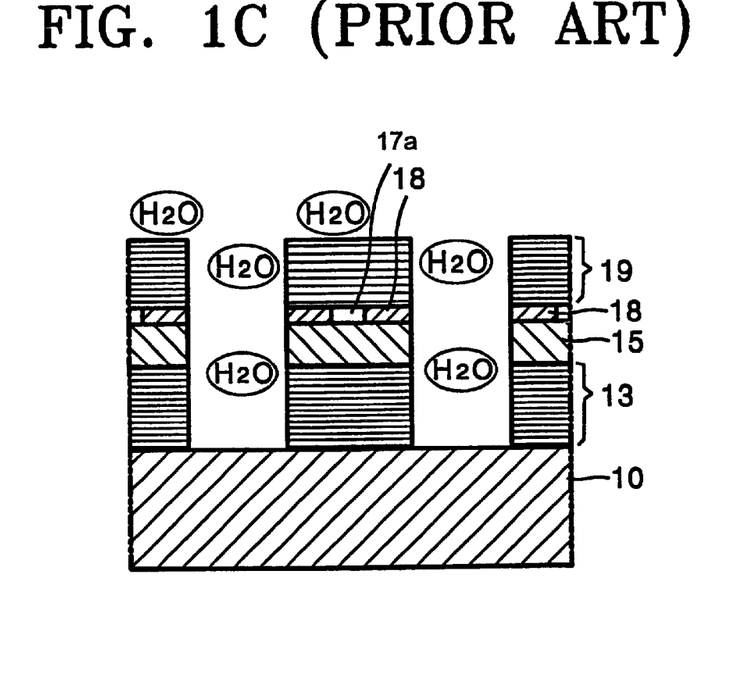

FIG. 1B shows that a plurality of VCSEL posts I, II and III and spaces 21 are formed after a dry etching process and through which light will be independently radiated. Referring to FIG. 1C, when an oxidation atmosphere is provided after the spaces 21 are formed, the pre-oxidized layer 17 is oxidized horizontally from its outside to its inside, thereby forming horizontally oxidized high-resistance portions 18 and current apertures 17a which are not oxidized.

Figure 1D:
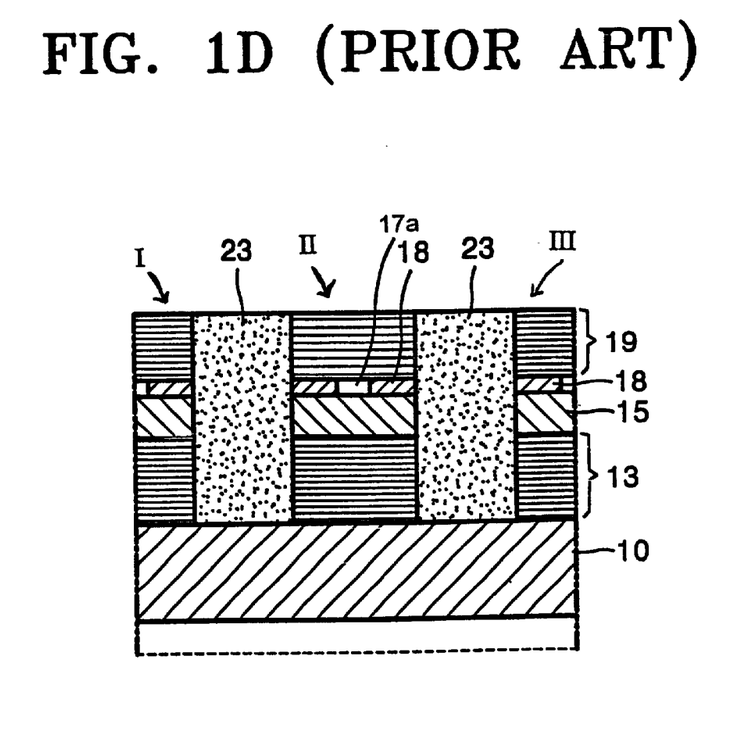

Subsequently, as shown in FIG. 1D, the spaces 21 are filled with polyimide fillings 23 in order to prevent the posts I, II, and III from being damaged during a lapping process. Then, the polyimide fillings 23 are planarized to be level with the surroundings. Afterwards, the resultant structure is turned over and most of the substrate 10 is removed by a lapping process.

Figure 1E:
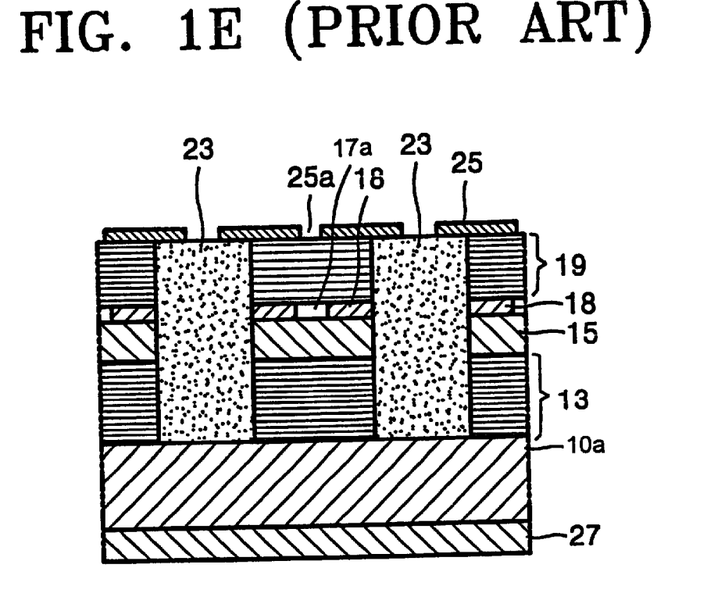

FIG. 1E shows that upper electrodes 25 having a window 25a is formed on the VCSEL posts I, II and III and the polyimide fillings 23. Finally, a lower electrode 27 is formed on a bottom surface of a lapped substrate 10a, thereby completing the manufacture of a VCSEL. VCSELs having the above structure may be used as a single chip array structure or may be cut at each polyimide portion to be used separately.

Figure 2A:
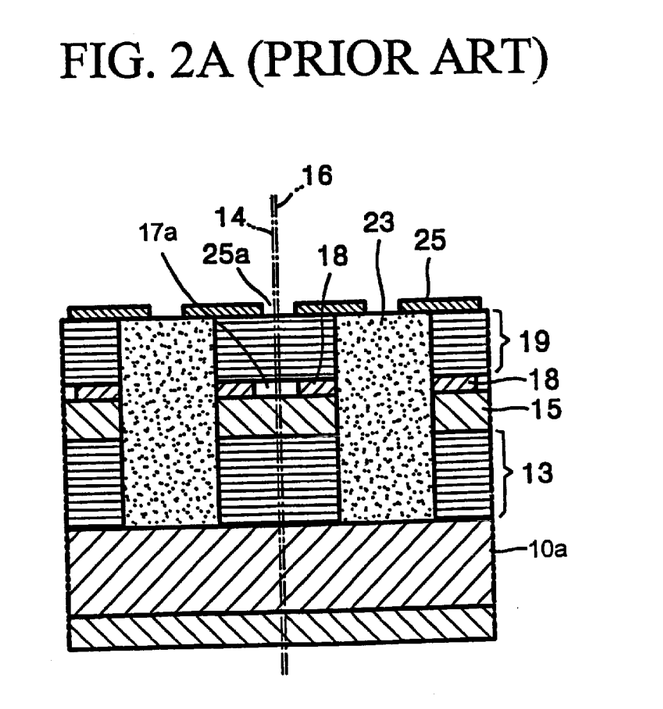
FIG. 2A is a sectional view of a VCSEL with a misaligned window and current aperture manufactured by a method shown in FIGS. 1A through 1E.

According to a conventional technique shown in FIG. 2A, the current apertures 17a formed by a horizontal oxidation process after the posts were formed and the window 25a of the upper electrodes 25 formed by a photolithographic process are not exactly aligned. Therefore, an alignment error exists where a central axis 16 of the window 25a and a central axis 14 of the aperture 17a deviate from each other. Such an alignment error results in a loss of emitted light and hinders formation of an exact Gaussian beam, thereby degrading the electro-optical characteristics of a VCSEL.

Figure 2B:
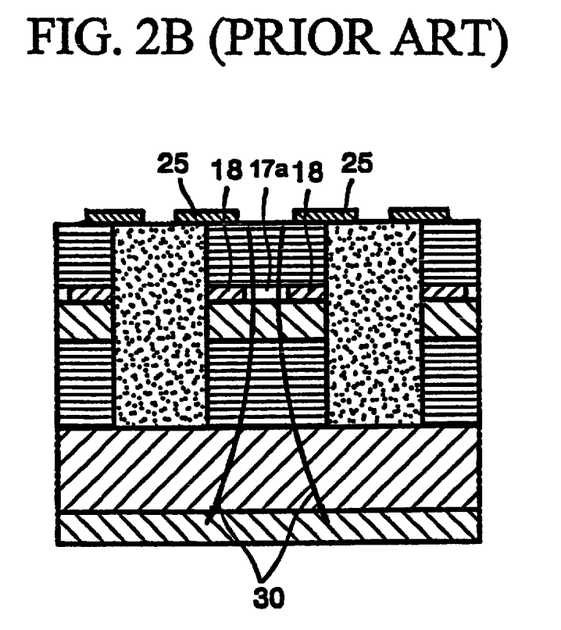
FIG. 2B is a sectional view of a VCSEL having a conventional electrode pulling structure.
Figure 2C:
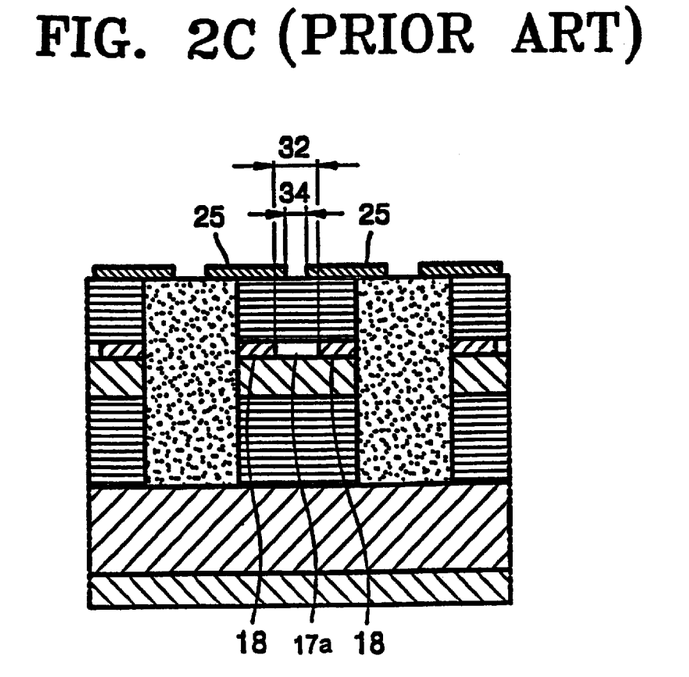
FIG. 2C is a sectional view of a VCSEL having a conventional electrode pushing structure.

To take into account of an alignment error, FIG. 2B shows a VCSEL designed by way of "electrode pulling." Here, the upper electrodes 25 are formed beyond the region of the current apertures 17a between the high-resistance portions 18. However, a current path 30 is lengthened and the overall device resistance is increased. Alternatively, FIG. 2C shows a VCSEL design according to "electrode pushing." In this case, the upper electrodes 25 are formed to extend over the current apertures 17a between the high-resistance portions 18. Because an upper electrode window size 34 is smaller than a current aperture size 32, a loss of emitted light occurs.

Therefore, it is necessary to exactly align the central axis of an upper electrode window and the central axis of a current aperture.

SUMMARY OF THE INVENTION

To solve the above and other problems, it is an object of the present invention to provide a semiconductor light-emitting device with improved electro-optical characteristics by exactly aligning a central axis of an upper electrode window and a central axis of a current aperture, and a method of manufacturing the same.

Additional objects and advantages of the invention will be set forth in part in the description which follows, and, in part, will be obvious from the description, or may be learned by practice of the invention.

To achieve the above and other objects of the present invention, there is provided a semiconductor light-emitting device having a post that is composed of a plurality of layers including at least one pre-oxidized layer on a substrate, and an upper electrode on the post, the semiconductor light-emitting device is manufactured according to an embodiment of the present invention by forming the post by etching, by way of self-alignment using the upper electrode, and horizontally oxidizing the pre-oxidized layer by a predetermined distance from a sidewall of the post.

According to another embodiment of the present invention, the post is formed using the upper electrodes as a guide during an etching process to align a central axes of a window defined by the upper electrodes and a central axes of a current aperture of the pre-oxidized layer.

According to an aspect of the invention, during the etching process, a sidewall of the pre-oxidized layer included in the post is exposed, and the pre-oxidized layer is horizontally oxidized by an oxidizing process to a predetermined distance from the sidewall.

According to another aspect of the invention, when a diameter of the post is about 60 μm, about 45–50 μm of the pre-oxidized layer is oxidized, a portion of the pre-oxidized layer oxidized by the oxidizing process becomes a high-resistance portion, and a portion of the pre-oxidized layer unoxidized during the oxidizing process becomes the current aperture through which current or light passes, and since the post is formed by way of self-alignment using the upper electrode, and the current aperture is formed to correspond to the exposed sidewall of the post, the central axis of the window of the upper electrode and the central axis of the current aperture are automatically aligned, such that, due to the exact alignment between the window and the current aperture, the electro-optical characteristics of the Vertical Cavity Surface Emitting Laser (VCSEL) are improved.

In the present invention, the window of the upper electrode is passivated by a photoresist in order to avoid damage during the etching process. Simultaneously, the surface of the upper electrode is partially or entirely passivated by the photoresist. When the surface of the upper electrode is partially passivated and even if a portion of the upper electrode exposed during the etching process is damaged, the remaining portion of the upper electrode protected by the photoresist is sufficient to demonstrate conductivity as an electrode.

BRIEF DESCRIPTION OF THE DRAWINGS

The above and other objects and advantages of the present invention will become more apparent and more readily appreciated by describing in detail preferred embodiments thereof with reference to the accompanying drawings in which.

DETAILED DESCRIPTION OF THE EMBODIMENTS

Reference will now be made in detail to the present preferred embodiments of the present invention, examples of which are illustrated in the accompanying drawings, wherein like reference numerals refer to like elements throughout. The embodiments are described below in order to explain the present invention by referring to the figures.

Figure 3A:
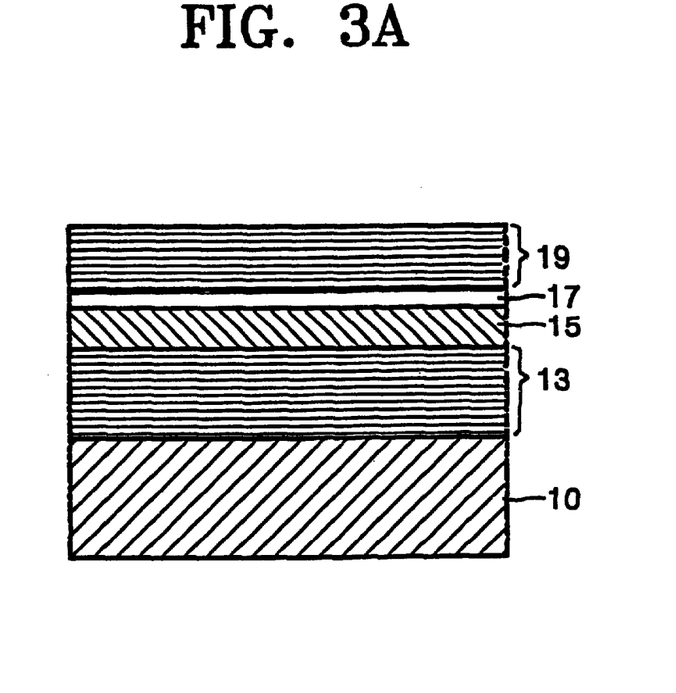
FIGS. 3A through 3G are sectional views of a VCSEL at various stages of process according to an embodiment of the present invention.

FIG. 3A shows a stacked semiconductor structure used for manufacturing a semiconductor light-emitting device (hereinafter, referred to as a Vertical Cavity Surface Emitting Laser (VCSEL)) according to an embodiment of the present invention. A VCSEL of the present invention has a stacked semiconductor structure in which light is emitted in a direction perpendicular to a plane of a layer. Such a stacked semiconductor structure is formed by an epitaxial deposition such as a Metal-Organic Chemical Vapor Deposition (MOCVD), a Liquid Phase Epitaxy (LPE), a Molecular Beam Epitaxy (MBE), or other well-known crystal growth methods.

As shown in FIG. 3A, the stacked semiconductor structure includes a substrate 10, a lower reflector layer 13, an active layer 15, a pre-oxidized layer 17, and an upper reflector layer 19.

The substrate 10 used in manufacturing a VCSEL according to the present invention is, for example, an n-type GaAs substrate having a high concentration of impurities. The impurity concentration is, for example, $5 \times 10^{18}$ cm$^{-3}$. The GaAs substrate facilitates epitaxial deposition of such compositional layers as AlGaAs or AlAs.

The lower reflector layer 13 is formed on the substrate 10. As occasion demands, a semiconductor buffer layer (not shown), such as a GaAs thin film of about 0.5 μm, may be epitaxially deposited on the substrate 10 before the lower reflector layer 13 is formed. The lower reflector layer 13 is formed of a distributed Bragg reflector (DBR) having the same conductivity as the substrate 10 (i.e., an n-type in a superlattice structure). The lower reflector layer 13 is formed on the substrate 10 by an epitaxial deposition such as MOCVD and/or MBE. The lower reflector layer 13 performs internal reflection in a VCSEL structure. The lower reflector layer 13 includes a plurality of $Al_xGa_{1-x}As$ layers and a plurality of $Al_yGa_{1-y}As$ layers that are alternately stacked (not shown). Each $Al_yGa_{1-y}As$ layer has a low aluminum content of about 10% so that it usually has a predetermined refractive index. Each $Al_xGa_{1-x}As$ layer has a high aluminum content of about 95%. Preferably, each alternating layer constituting the lower reflector layer 13 has an effective optical thickness of about ¼ of a wavelength of the light generated by the VCSEL. It is preferable that the lower reflector layer 13 has a reflectance of about 100% as a whole, if possible, in order to achieve high internal reflection in the VCSEL. The reflectance of the lower reflector layer 13 depends on a difference in a refractive index between $Al_xGa_{1-x}As$ and $Al_yGa_{1-y}As$ and the number of pairs of $Al_xGa_{1-x}As$ and $Al_yGa_{1-y}As$ in the lower reflector layer 13. Accordingly, as the difference in the refractive index and the number of pairs of alternating layers increases, the higher the reflectance that can be obtained.

The active layer 15 is formed on the lower reflector layer 13 by an epitaxial deposition. The active layer 15 includes at least one quantum well layer, a barrier layer surrounding the quantum well layer, and a cladding layer surrounding the barrier layer (not shown). Here, it is preferable that the barrier layer has a middle energy band gap between the energy band gap of the quantum well layer and the energy band gap of the cladding layer. The active layer 15 is designed to provide sufficient optical gain to the VCSEL. For example, in order to manufacture a VCSEL for emitting light having a wavelength of 980 nanometers, the active layer 15 is formed by alternately stacking three quantum well layers of $In_{0.2}Ga_{0.8}As$ each having a thickness of 8 nanometers and barrier layers of GaAs each having a thickness of 10 nanometers, and surrounding each quantum well layer and forming cladding layers of $Al_{0.5}Ga_{0.8}As$ so that the stack of quantum well layers and barrier layers are sandwiched between the cladding layers. In FIGS. 3A–3G, a quantum well layer, a barrier layer, and a cladding layer are not distinguished from each other and are illustrated as a single active layer 15 in order to simplify the drawings.

The pre-oxidized layer 17 is formed on the active layer 15 by an epitaxial deposition. The pre-oxidized layer 17 is doped with the same type of dopant as a nearest reflector layer. Since the pre-oxidized layer 17 is positioned between the active layer 15 and an upper reflector layer 19, the pre-oxidized layer 17 is doped with the same type of dopant as the upper reflector layer 19. For example, the pre-oxidized layer 17 is doped with a p-type dopant at concentration of about $10^{18}$ $cm^{-3}$. In addition, the pre-oxidized layer 17 includes a semiconductor alloy containing an aluminum, for example, AlAs or AlGaAs, which can be partially oxidized after a post is formed. Therefore, an oxidized portion of the pre-oxidized layer 17 increases in resistance, and an unoxidized portion passes current and light as a current aperture. The pre-oxidized layer 17 is oxidized starting from the sidewall of each post formed by an etching process described below, towards the inside so that the oxidized portion usually has a circular shape. Here, the shape of the oxidized portion depends on the shape of the post and the number of sidewalls exposed in an oxidizing process. The shape of the oxidized portion can be influenced or controlled by the composition of the semiconductor alloy contained in the pre-oxidized layer 17, the orientation of the alloy, the thickness of the pre-oxidized layer 17, and the conditions of the oxidizing process. For example, during an oxidizing process, aqueous vapor contained in $N_2$ carrier gas oxidizes AlAs at a temperature of 400–500° C., thereby forming an aluminum oxide.

Typically, AlAs containing 100% Al is oxidized by about 1.5 µm per minute at 450° C., and AlGaAs containing 80% Al is oxidized by about 0.01 µm per minute. U.S. Pat. Nos. 5,262,360 and 5,373,522 issued to Holonyak, Jr. et al. and U.S. Pat. No. 5,493,577 issued to Choquette et al., the disclosures of which are incorporated by reference, can be referred to for more details about the shape of an oxidized portion and the conditions of a proper process.

The upper reflector layer 19 is formed on the pre-oxidized layer 17 by an epitaxial deposition. Like the lower reflector layer 13, the upper reflector layer 19 is formed by alternately stacking a plurality of $Al_xGa_{1-x}As$ layers and a plurality of $Al_yGa_{1-y}As$ layers. However, the upper reflector layer 19 is doped with impurities of a different conductivity than the lower reflector layer 13. In other words, when the lower reflector layer 13 and the substrate 10 are doped with an n-type dopant, the upper reflector layer 19 is preferably doped with a p-type dopant. In addition, the upper reflector layer 19 is designed to have a smaller number of layers than the lower reflector layer 13 in order to reduce its reflectance and allow the VCSEL to emit light. The preferred upper reflector layer 19 usually has a reflectance of 98–99%.

The active layer 15 and the pre-oxidized layer 17 are sandwiched between the lower reflector layer 13 and the upper reflector layer 19. Therefore, the upper reflector layer 19 and the lower reflector layer 13 form a resonant surface for resonating light generated from the active layer 15.

Figure 3B:
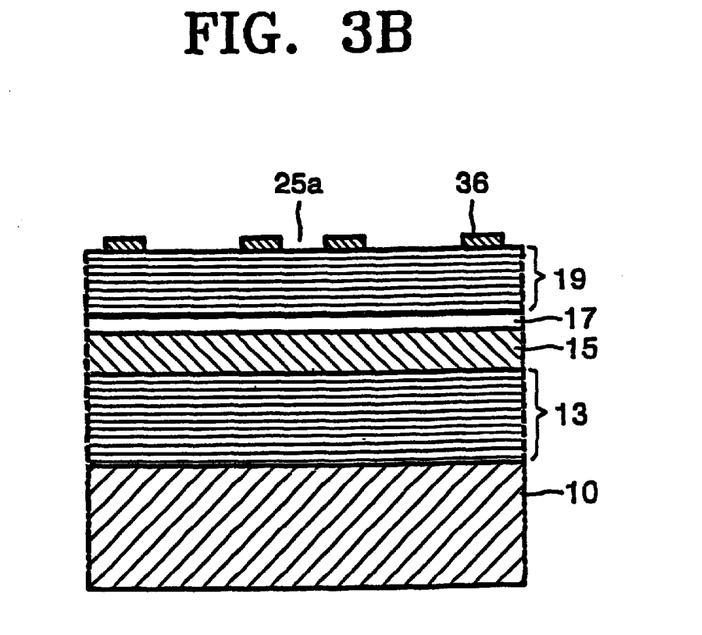

FIG. 3B shows upper electrodes 36 formed on the upper reflector layer 19 of the resultant structure of FIG. 3A. The upper electrodes 36 are formed by depositing, for example, AuBe/Ti/Au metal or Cr/Au metal on the p-type upper reflector layer 19. The upper electrodes 36 define a window 25a there-between and at a predetermined position using a photolithographic masking process or a lift-off process.

Figure 3C:
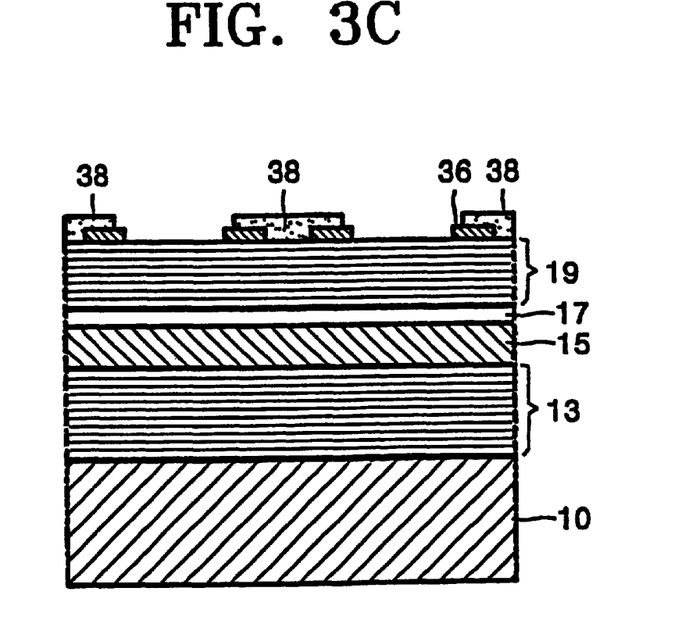

FIG. 3C shows that after windows 25a of the upper electrodes 36 are formed, photoresists 38 are patterned around the windows 25a. It is preferable that the photoresists 38 are blanket-deposited over the upper electrodes 36 and the windows 25a because an exposed upper electrode 36 is damaged during a later etching process. However, even if a part of an electrode 36 is exposed, taking into account of an error in patterning the photoresist 38, the remaining part of the electrode 36 is sufficiently protected by the photoresist 38 to maintain conductivity as an electrode 36.

Figure 3D:
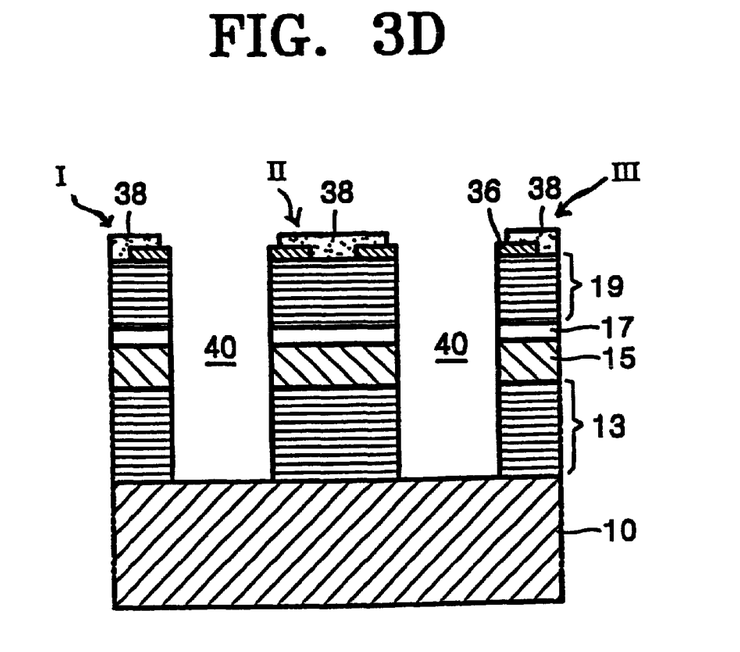

FIG. 3D shows spaces 40 and posts I, II and III of a mesa type formed by an etching process using the upper electrodes 36 and the photoresists 38 as a mask. Through such a process of forming the posts I, II and III, edges of the stacked materials are exposed. A wet or dry etching process can be used to form the posts I, II and III. Preferably, a dry etching process such as a reactive ion etching (RIE) is used to obtain the accurate depth and uniform surface of a sidewall. RIE is disclosed in detail in U.S. Pat. No. 5,034,092, entitled "Plasma Etching of Semiconductor Substrates," the disclosure of which is incorporated by reference. Alternatively, various other types of dry etching, such as Reactive Ion Beam Etching (RIBE), Chemically Assisted Ion Beam Etching (CAIBE), and Ion Beam Activated Gas Surface Chemistry (IBAGSC) (refer to U.S. Pat. No. 5,116,461, entitled "Method for Fabricating an Angled Diffraction Grating" and disclosure of which is incorporated by reference) can be used.

An accurate etching depth can be provided by an in-situ process using a reflected light measuring apparatus, and an etching process can be stopped after the pre-oxidized layer 17 is etched downward.

Figure 3E:
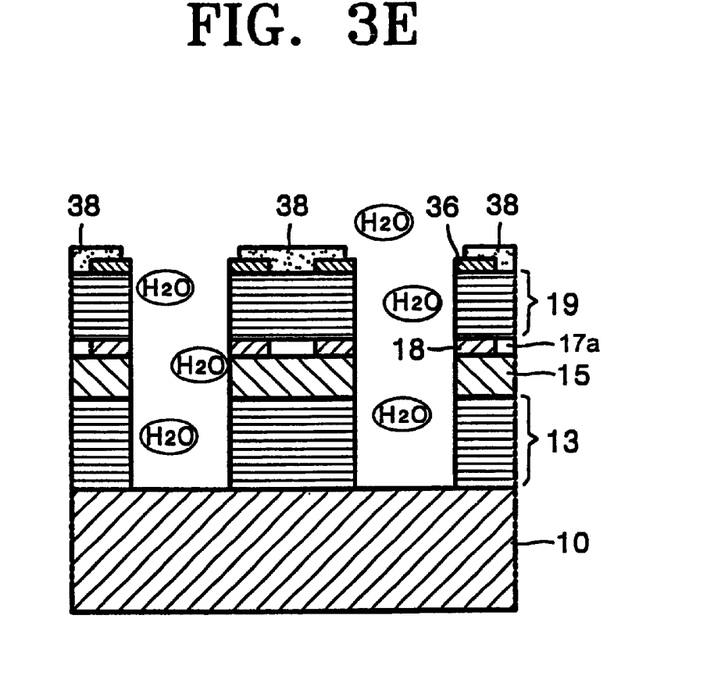

After the posts I, II and III are formed, an oxidizing process as shown in FIG. 3E is performed on the pre-oxidized layer 17. Such an oxidizing process was proposed for the first time in U.S. Pat. No. 5,262,360, entitled "AlGaAs Native Oxide," the disclosure of which is incorporated by reference. In U.S. Pat. No. 5,262,360, an aluminum-containing Group III–V semiconductor material is exposed to a water-containing environment at a temperature of about 375° C. to convert at least a portion of the aluminum-containing material into a native oxide.

U.S. Pat. No. 5,373,522 entitled "Semiconductor Devices with Native Aluminum Oxide Regions," the disclosure of which is incorporated by reference, discloses the structure of a semiconductor laser using the oxidizing method disclosed in U.S. Pat. No. 5,262,360. In U.S. Pat. No. 5,373,522, a native oxide formed from aluminum according to U.S. Pat. No. 5,262,360 is used as a current blocking layer within a semiconductor laser.

Meanwhile, in U.S. Pat. No. 5,493,577 entitled "Efficient Semiconductor Light Emitting Device and Method," the disclosure of which is incorporated by reference, a current blocking layer formed according to U.S. Pat. No. 5,373,522 is used in a VCSEL structure. The structure and effects of a VCSEL employing a current blocking layer were introduced by Choquette "Selectively Oxidized Vertical-Cavity Laser Performance and Technology", IEEE, pp. 283–288, (1998) the disclosure of which is incorporated by reference.

A selective oxidizing process performed in the present invention and a current aperture formed by the selective oxidizing process are based on the above documents which have been incorporated by reference. In other words, a selective oxidizing process is performed by positioning a VCSEL wafer in a container and heating the wafer in a controlled environment maintaining a high percentage of humidity, preferably at a temperature of 350–500° C., and more preferably, at a temperature of 400–450° C. Here, the pre-oxidized layer 17 is horizontally oxidized from the sidewall of each etched posts I, II and III toward the center of the posts I, II and III. Meanwhile, the layers 13, 15 and 19 other than the pre-oxidized layer 17 in the stack structure are not oxidized because their aluminum content is small.

Oxidized portions 18 of the pre-oxidized layer 17 subjected to the selective etching method usually have a circular shape, high resistance or insulation electrically, and a low refractive index of about 1.6. Unoxidized portions of the pre-oxidized layer 17 become current apertures 17a through which an electric current flows and a passage through which light is emitted. The oxidized portions 18 surrounding the current apertures 17a have a donut shape when viewed from the above the posts I, II and III.

When the electric current passes through the current apertures 17a and reaches the center of the active layer 15, the density of the carriers in the active layer 15 increases due to this current channeling. The increase in the density of the carriers results in the increase in the efficiency of generating light.

Figure 3F:
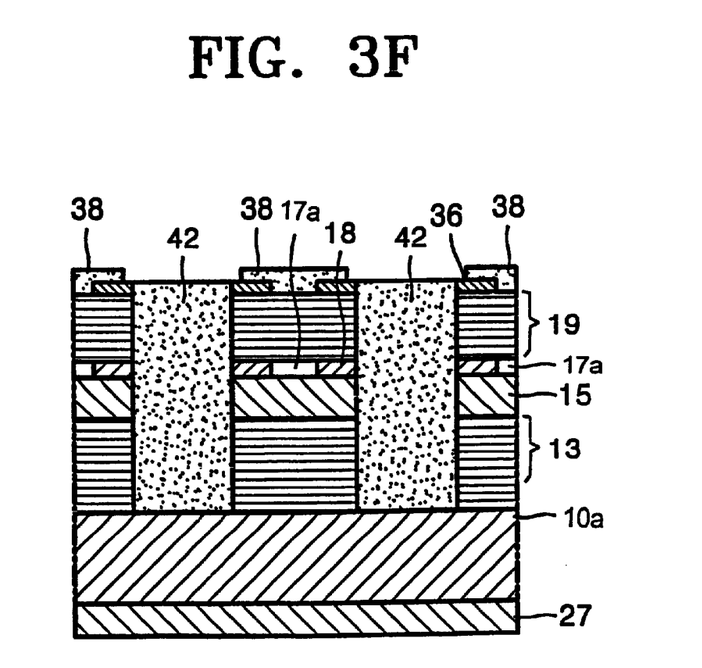

FIG. 3F shows that spaces around the posts I, II and III are filled with polyimide fillings 42 after the current apertures 17a are formed by the oxidizing process. The polyimide fillings 42 minimize the damage to the posts I, II and III during a process of lapping the substrate 10 into a lapped substrate 10a.

The bottom of the substrate 10 is lapped in order to facilitate cutting of the wafer. Afterwards, a lower electrode 27 is formed by depositing patterned AuGe/Ni/Au on the entire bottom surface of the lapped substrate 10a or by blanket-metalizing the bottom surface of the lapped substrate 10a. The lower electrode 27 is annealed together with the upper electrodes 36, thereby becoming an electrode portion of the VCSEL.

The lower electrode 27 includes opaque metals or semi-transparent metals. For example, the lower electrode 27 has a multi-layer structure including AuGe having a thickness of about 800 Å, Ni having a thickness of about 200 Å, and Au having a thickness of about 400 Å.

Figure 3G:
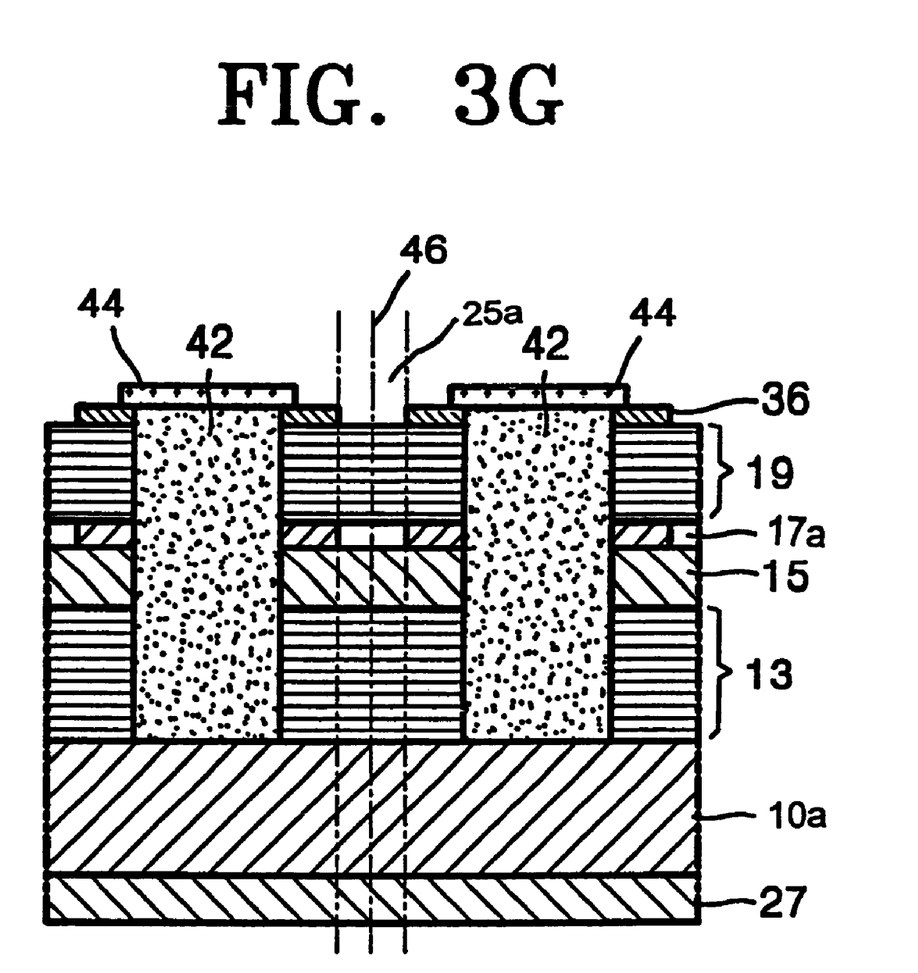

FIG. 3G shows that after forming the lower electrode 27 on the lapped substrate 10a, wire bonding pads 44 are formed on the upper electrodes 36 that has been used as masks to form the posts I, II and III to complete the VCSEL array. As shown in FIG. 3G, a central axis 46 of the window 25a is also a central axis of the current aperture 17a.

VCSELs manufactured through the above steps may be used as a single chip array structure or may be cut at each polyimide portion to be used separately.

According to a conventional technology, a post is formed first, and then a window of an upper electrode is formed to correspond to a current aperture formed by oxidizing a pre-oxidized layer. It is difficult to align the central axis of the window of the upper electrode and the central axis of the current aperture. As a result, an alignment error occurs, thereby deteriorating the electro-optical characteristics of a VCSEL.

In contrast, the present invention forms an upper electrode first, forms a post by performing an etching process using the upper electrode and forms a current aperture using an oxidizing process so that the central axis of a window defined by the upper electrode and the central axis of the current aperture are self-aligned. Accordingly, compared to a conventional VCSEL, a VCSEL of the present invention has improved electro-optical characteristics due to the exact alignment of the central axis of the window of an upper electrode and the central axis of the current aperture.

While a VCSEL having a single current aperture on an active layer within a post has been described, at least one current aperture can be formed above and/or below the active layer in order to control the optical characteristics of the VCSEL.

In addition, while an embodiment of the present invention has been described with reference to a post having a circular shape when viewed in a direction in which light is emitted from a VCSEL to achieve circular light emission, the present invention can be applied to a post having a rectangular, square, elliptical, or other shapes, rather than the circular shape according to the use of an emitted light.

Furthermore, while a photoresist is disclosed as being formed on a part or on the entire surface of an upper electrode and is then etched to form a post in an embodiment of the present invention, the etching process may be performed after sidewalls are formed at both opposite ends of the electrode.

In addition, it is understood that materials, thickness, the arrangement of the layers and the method of forming and etching the layers can be varied without departing from the spirit and scope of the invention. Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of manufacturing a semiconductor light-emitting device and/or array comprising:

obtaining a substrate having a lower reflector layer, an active layer, a pre-oxidized layer, and an upper reflector layer sequentially layered on a front surface of a substrate;

patterning upper electrodes to define a window on the upper reflector layer of the device;

forming a photoresist on a portion of the upper electrodes including the window;

forming a post by performing an etching process using an uncovered portion of the upper electrodes on which the photoresist is not formed and/or the photoresist as a mask until the pre-oxidized layer is exposed;

oxidizing a portion of the pre-oxidized layer;

filling an etched portion resulting from the etching process with a filler; and forming a lower electrode on a back surface of the substrate.

2. The method of claim 1, wherein the method of manufacturing the semiconductor light-emitting device and/or array further comprises separating a formed semiconductor light-emitting array into a separate array having at least one semiconductor light-emitting device.

3. The method of claim 1, wherein said obtaining the substrate having the layers comprises forming of the lower reflector layer, the active layer, the pre-oxidized layer, and the upper reflector layer comprises using an epitaxial deposition including a Metal-Organic Chemical Vapor Deposition (MOCVD), a Liquid Phase Epitaxy (LPE), or a Molecular Beam Epitaxy (MBE).

4. The method of claim 3, wherein the forming of the posts by the etching process comprises a wet or dry etching including a Reactive Ion Etching (RIE), a Reactive Ion Beam Etching (RIBE), a Chemically Assisted Ion Beam Etching (CAIBE), or an Ion Beam Activated Gas Surface Chemistry (IBAGSC).

5. The method of claim 4, wherein said forming of the posts by the etching process further comprises using a reflected light measuring apparatus to obtain an accurate etching depth.

6. The method of claim 5, wherein said oxidizing the portion of the pre-oxidized layer comprises exposing the post to a water-containing environment at a temperature of 350–500° C., and horizontally oxidizing a sidewall of the post towards a center of the post to a predetermined distance.

7. The method of claim 6, wherein said patterning of the upper electrodes comprises depositing layers of a metal and/or metal alloy including AuBe/Ti/Au or Cu/Au on the upper reflector layer.

8. The method of claim 7, wherein said forming of the lower electrode comprises depositing and/or blanket-metalizing opaque metals and/or semitransparent metals including AuGe/Ni/Au having a respective thickness of - 800 Å/1200 Å/400 Åon the back surface of the substrate.

9. The method of claim 8, further comprising lapping the back surface of the substrate to a set distance prior to said forming of the lower electrode.

10. The method of claim 9, further comprising separating the formed semiconductor light-emitting array into a separate array having at least one semiconductor light-emitting device.

11. The method of claim 1, further comprising forming the pre-oxidized layer above and/or below the active layer.

12. The method of claim 1, further comprising forming wire bond pads on the upper electrodes and/or the filler.

13. The method of claim 1, further comprising forming a buffer layer between the substrate and the lower reflector layer.

14. The method of claim 1, wherein said filling with the filler comprises surrounding a sidewall of the post with a polyimide.

15. A method of manufacturing a semiconductor light-emitting array including a substrate and a lower reflector layer, an active layer, at least one pre-oxidized layer, and an upper reflector layer which are sequentially formed on a front surface of the substrate, the method comprising:

patterning upper electrodes to define a window on the upper reflector layer of the array;

forming photoresists on a portion of the upper electrodes including the window;

forming a post or posts by performing an etching process using an uncovered portion of the upper electrodes on which the photoresists are not formed and/or the photoresists as masks through a portion of the pre-oxidized layer;

oxidizing the exposed portion of the pre-oxidized layer; and forming a lower electrode on a back surface of the substrate.

16. The method of claim 15, further comprising separating the semiconductor light-emitting array into a separate array having at least one semiconductor light-emitting device.

17. The method of claim 15, further comprising forming at least one other pre-oxidized layer above and/or below the active layer.

18. The method of claim 15, further comprising forming wire bond pads on the upper electrodes.

19. The method of claim 15, further comprising forming a buffer layer between the substrate and the lower reflector layer.

20. The method of claim 15, further comprising filling an etched portion resulting from the etching process with a filler.

21. The method of claim 15, wherein the forming of the photoresists comprises forming the photoresists on an entire surface of the upper electrodes including the window.

22. The method of claim 15, wherein the forming of the posts comprises performing the etching process until the front surface of the substrate is exposed.

23. A method of manufacturing a semiconductor light-emitting array including a substrate and a lower reflector layer, an active layer, at least one pre-oxidized layer, and an upper reflector layer which are sequentially formed on a front surface of the substrate, the method comprising:

patterning upper electrodes defining a window on the upper reflector layer of the array;

forming a photoresist on a portion of the entire surface of the upper electrodes including the window;

forming a post by performing an etching process using an uncovered portion of the upper electrodes on which the photoresist is not formed and/or the photoresists as a masks until a portion of the pre-oxidized layer is exposed;

oxidizing an exposed portion of the pre-oxidized layer;

filling an etched portion resulting from the etching process with a filler; and forming a lower electrode on a back surface of the substrate.

24. The method of claim 23, further comprising forming additional posts using the etching process, and separating the semiconductor light-emitting array into a separate array having at least one semiconductor light-emitting device.

25. The method of claim 23, further comprising forming at least one other pre-oxidized layer above and/or below the active layer.

26. The method of claim 23, further comprising forming wire bond pads on the upper electrodes and/or the filler.

27. The method of claim 23, further comprising forming a buffer layer between the substrate and the lower reflector layer.

28. The method of claim 1, wherein:

the photoresist is not formed on the uncovered portion of the upper electrodes during the forming the photoresist, and the forming the post further comprises using the uncovered portion of the upper electrodes as the mask.

29. The method of claim 15, wherein:

the photoresists are not formed on the uncovered portion of the upper electrodes during the forming the photoresist, and the forming the post or posts further comprises using the uncovered portion of the upper electrodes as the masks.

30. The method of claim 24, wherein:

the photoresist is not formed on the uncovered portion of the upper electrodes during the forming the photoresist, and the forming the post further comprises using the uncovered portion of the upper electrodes as the mask.

* * * * *

UNITED STATES PATENT AND TRADEMARK OFFICE
CERTIFICATE OF CORRECTION

PATENT NO. : 6,689,631 B2
DATED : February 10, 2004
INVENTOR(S) : Dong-hoon Chang It is certified that error appears in the above-identified patent and that said Letters Patent is hereby corrected as shown below:

Column 10,
Line 28, change "masks" to -- mask --;
Line 60, change "Claim 24" to -- Claim 23 --.

Signed and Sealed this

Eighteenth Day of May, 2004

JON W. DUDAS
*Acting Director of the United States Patent and Trademark Office*